United States Patent
Lien

(10) Patent No.: US 9,477,363 B2
(45) Date of Patent: Oct. 25, 2016

(54) TOUCH PANEL

(71) Applicant: HannsTouch Solution Inc., Tainan (TW)

(72) Inventor: Che-Wei Lien, Tainan (TW)

(73) Assignee: HannsTouch Solution Incorporated, Tainan (TW)

( * ) Notice: Subject to any disclaimer, the term of this patent is extended or adjusted under 35 U.S.C. 154(b) by 0 days.

(21) Appl. No.: 14/534,171

(22) Filed: Nov. 6, 2014

(65) Prior Publication Data

US 2016/0054828 A1 Feb. 25, 2016

(30) Foreign Application Priority Data

Aug. 19, 2014 (TW) .............................. 103214803 U

(51) Int. Cl.
G06F 3/044 (2006.01)
G06F 3/041 (2006.01)

(52) U.S. Cl.
CPC ............. *G06F 3/044* (2013.01); *G06F 3/0416* (2013.01); *G06F 2203/04103* (2013.01); *H03K 2217/960755* (2013.01); *H03K 2217/960775* (2013.01)

(58) Field of Classification Search
CPC .. G06F 3/03547; G06F 3/041; G06F 3/0412; G06F 3/047; G06F 3/044; G06F 3/045; G06F 2203/04111; G06F 2203/04112; G06F 2203/04113
See application file for complete search history.

(56) References Cited

U.S. PATENT DOCUMENTS

| 2014/0022202 A1* | 1/2014 | Badaye | G06F 3/044 345/174 |
| 2014/0049121 A1* | 2/2014 | Liu | G06F 3/0418 307/650 |
| 2015/0041778 A1* | 2/2015 | Chang | H01L 27/3262 257/40 |
| 2015/0212548 A1* | 7/2015 | Namkung | G06F 1/1652 345/174 |
| 2015/0287381 A1* | 10/2015 | Kim | G09G 3/3696 345/174 |

* cited by examiner

*Primary Examiner* — Premal Patel
(74) *Attorney, Agent, or Firm* — Winston Hsu; Scott Margo

(57) ABSTRACT

A touch panel is provided. The touch panel includes a substrate, a plurality of first sensing pads, a plurality of second sensing pads and an extension sensing pad. The substrate has a body portion and an extension portion. The first sensing pads are arranged abreast on the body portion of the substrate along a first direction. The second sensing pads are arranged abreast on the extension portion of the substrate along a second direction. The material of the first sensing pads is different from the material of the second sensing pads. The extension sensing pad is arranged on the extension portion of the substrate. Thus, the touch panel can be extended to side portions of an electronic device, so as to replace functions of physical buttons by using the touch panel on the side portions.

14 Claims, 12 Drawing Sheets

TOUCH PANEL

CROSS-REFERENCE TO RELATED APPLICATION

This application claims the priority benefit of Taiwan application serial no. 103214803, filed on Aug. 19, 2014. The entirety of the above-mentioned patent application is hereby incorporated by reference herein and made a part of this specification.

BACKGROUND OF THE INVENTION

1. Field of the Invention

The invention relates to a touch panel, and more particularly, relates to a touch panel that can be extended to side portions of devices.

2. Description of Related Art

With the continuous development of the technology, touch panels have become an input device for various communication appliances and information products. A touch panel is stacked over a display module for a user to interact with display frame. In order to transmit signals generated when the user operates the touch panel, a plurality of sensing electrodes are disposed in the touch panel, so as to transmit the signals to a control circuit through a signal line. On the other hand, for a mobile device, the touch panel is usually disposed on a front side of the device, and physical buttons are disposed on lateral sides of the mobile device, so that the user may use some functions through the physical buttons.

At present, the sensing electrodes of the touch panel are mostly fabricated by adopting an indium tin oxide (ITO) film because the ITO film has advantages of transparency and high conductivity. However, because indium is expensive and the ITO film has a material property prone to embrittlement, it is difficult to dispose the touch panel fabricated by using the ITO film on a glass substrate having a greater curvature or a greater bending degree. Accordingly, although many manufacturers wish to extend the touch panel to the lateral sides of mobile devices to replace the physical buttons of the existing mobile devices, there are still technical problems to be solved.

SUMMARY OF THE INVENTION

The invention provides a touch panel, and the touch panel has a sensing pad structure (which is more flexible) disposed along bending or extension portions of the substrate, so that the bending or extension portions of the touch panel can also provide touch functions. Accordingly, the electronic device adopting this touch panel is capable of performing touch sensing at the lateral sides of the body thereof by using the bending portions of the substrate, so as to replace the functions of the physical buttons.

On the other hand, the invention provides a touch panel, and the touch panel has an extension sensing pad structure disposed along the extension portions of the substrate, and a density of sensing pattern of the extension sensing pad structure may be lower than that of a body sensing pad structure. Accordingly, the electronic device adopting this touch panel is capable of providing the touch functions at the lateral sides of the body thereof while saving the costs.

The invention proposes a touch panel, which includes a substrate, a plurality of first sensing pads, a plurality of second sensing pads and an extension sensing pad. The substrate has a body portion and an extension portion. Each of the first sensing pads is arranged abreast on the body portion of the substrate along a first direction. Each of the second sensing pads is arranged abreast on the body portion of the substrate along a second direction. The first direction is intersected with the second direction, and a material of the first sensing pads is different from a material of the second sensing pads. The extension sensing pad is arranged on the extension portion of the substrate, and the extension sensing pad is connected to one of the first sensing pads.

Furthermore, the invention also proposes a touch panel, which includes a substrate, a double-layer sensing pad structure and a single-layer sensing pad structure. The substrate has a body portion and an extension portion. The double-layer sensing pad structure is disposed on the body portion of the substrate. The double-layer sensing pad structure includes a plurality of first sensing pads and a plurality of second sensing pads, and a material of the first sensing pads is different from a material of the second sensing pad. The single-layer sensing pad structure is disposed on the extension portion of the substrate, and the single-layer sensing pad structure is connected to one of the first sensing pads of the double-layer sensing pad structure.

On the other hand, the invention also proposes a touch panel, which includes a substrate, a body sensing pad structure and an extension sensing pad structure. The substrate has a body portion and an extension portion. The body sensing pad structure is disposed on the body portion of the substrate. The extension sensing pad structure is disposed on the extension portion of the substrate. A density of sensing pattern of the body sensing pad structure is greater than a density of sensing pattern of the extension sensing pad structure.

Based on above, in the touch panel according to the embodiments of the invention, the single-layer sensing pad structure (which is more flexible) extended from the body sensing pad structure is disposed on the extension portion of the substrate, and the density of the single-layer sensing pad structure may be lower than that of the double-layer sensing pad structure. In other words, in the touch panel according to embodiments of the invention, the sensing electrodes are extended from the body sensing pad structure in the manner of the single-layer sensing pad structure, and the single-layer sensing pad structure is disposed on the extension portion of the substrate. Accordingly, the electronic device adopting this touch panel is capable of providing the touch functions at the lateral sides of the body thereof, so as to replace the functions of the physical buttons.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
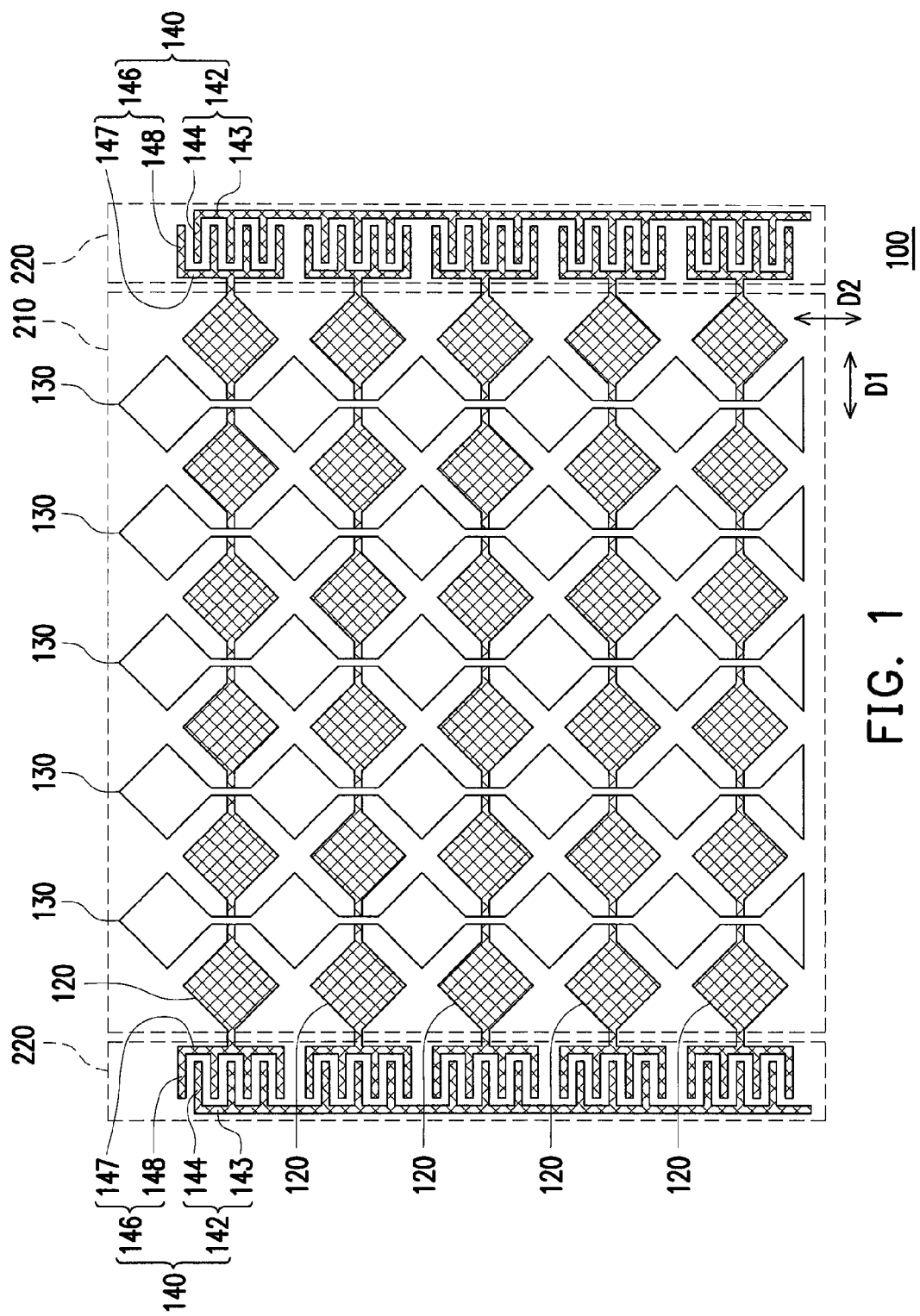
FIG. 1 is a schematic view of a touch panel according to various embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
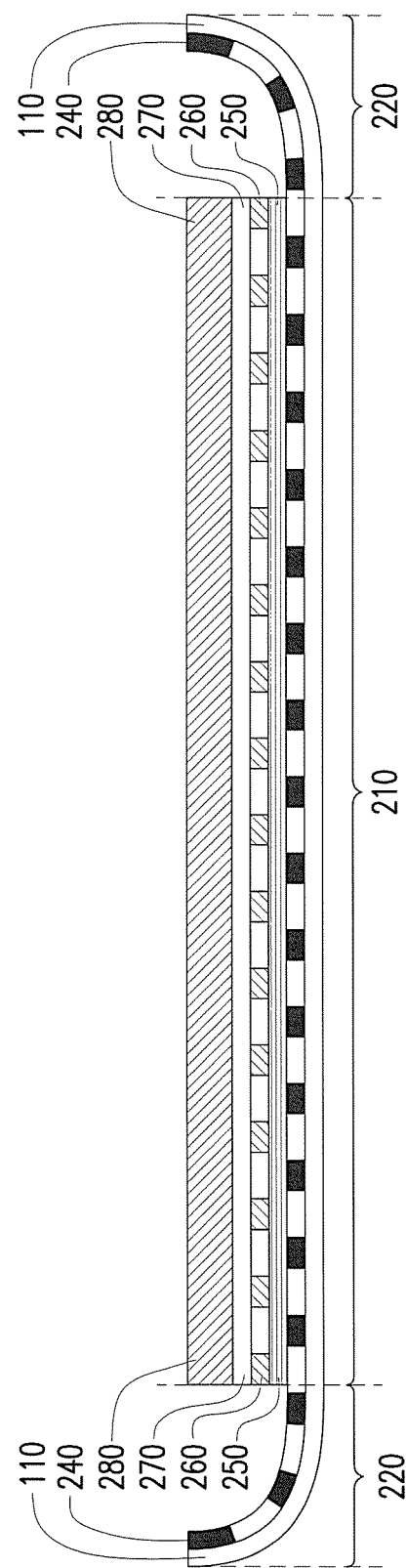
FIG. 2 is a cross-sectional view of a touch panel according to first embodiment of the invention.

FIG. 1 is a schematic view of a touch panel 100 according to various embodiments of the invention, and illustration of a substrate 110 of the touch panel is omitted in FIG. 1. FIG. 2 is a cross-sectional view of the touch panel 100 according to first embodiment of the invention. Referring to FIG. 1 and FIG. 2, the touch panel 100 of the present embodiment includes the substrate 110, a plurality of first sensing pads 120, a plurality of second sensing pads 130 and at least one extension sensing pad 140. The first sensing pads 120 and the extension sensing pads 140 collectively form a first sensing pattern layer 240, and the second sensing pads 130 forms a second sensing pattern layer 260. The substrate 110 of the present embodiment has a body portion 210 and an extension portion 220. The body portion 210 of the substrate 110 appears as a plane, and the extension portion 220 of the substrate 110 is not located on the plane of the body portion 210 and a plane region extended from that plane. That is, the body portion 210 and the extension portion 220 are not located on the same horizontal plane and not parallel to each other. The extension portion 220 of the substrate 110 can be bent and extended towards two sides of body portion 210 according to a specific curvature. Alternatively, the extension portion 220 of the substrate 110 can appear as a right angle shape or any angular shapes with respect the body portion 210, or the extension portion 220 can be other shapes. Use of aforementioned substrate 110 aims to extend the substrate of the touch panel to side portions of an electronic device, so that the sides portions of the electronic device can also provide touch functions.

The first sensing pads 120 are arranged abreast on the body portion 210 of the substrate 110 along a first direction D1 (e.g., X-axis direction). The second sensing pads 130 are arranged abreast on the body portion 210 of the substrate 110 along a second direction D2 (e.g., Y-axis direction). The first direction D1 is intersected with the second direction D2. In the present embodiment, the first direction D1 and the second direction D2 are vertically intersected. However, persons applying the present embodiment should understand that the first direction D1 and the second direction D2 can also be intersected in other different angles. The first sensing pads 120 and the second sensing pads 130 serve as sensing electrodes of the body portion 210 of the substrate 110 to be respectively connected a touch control circuit for controlling touch operations. A material of the first sensing pads 120 can be a conductive material which is more flexible, such as metal, nano silver and graphene and so on. Because metal belongs to a non-light-transmissive material, when the first sensing pads 120 are implemented by using a metal material, a structure of the first sensing pad 120 can be designed to be a metal mesh as shown in FIG. 1, so as to increase light transmittance thereof. A material of the second sensing pads 130 can be a conductive material which is less flexible but has high light transmittance and high conductivity, such as an ITO film. In the present embodiment, the materials of the first sensing pads 120 and the second sensing pads 130 are not the same, such that reduction on process yield due to breakages caused by the first sensing pads 120 being the ITO film which is not flexible but frangible can be prevented from happening on an intersection between the first sensing pads 120 and the extension sensing pad 140. If the first sensing pads 120 and the second sensing pads 130 are simply implemented by using the metal mesh (which is more flexible), visual experience of a user may be influenced by the moire effect generated by interferences of grid lines on the metal mesh structure of the first sensing pads 120 and the second sensing pads 130 on the body portion 210. In other words, in order to prevent reduction of process yield and increasing costs due to simple use of the ITO film and to prevent occurrence of the moire effect, two different materials are used in the touch panel of the present embodiment to form the first sensing pads and the second sensing pads respectively on the body portion of the substrate. From another perspective, the first sensing pads 120 and the second sensing pads 130 may also be referred to as a double-layer sensing pad structure.

In the present embodiment, extension sensing electrodes in form of a single-layer sensing pad structure are disposed on the extension portion 220 of the substrate 110, such that the extension portion 220 can also provide the touch functions. In other words, because the material of the first sensing pads 120 is the conductive material (which is more flexible), the first sensing pads 120 are extended outside the extension sensing pad 140 in the embodiments of the invention, so that the touch control circuit can sense touch actions operated by the user at the body portion 210 and the extension portion 220. On the other hand, it not required for the side portions of the electronic device to include a sensing capability which is overly sensitive, and the extension sensing pad 140 is mainly used to replace functions of the physical buttons. Therefore, a density of sensing pattern of the extension sensing pad 140 may be lower than a density of sensing pattern of a body sensing pad structure (also known as a double-layer sensing pad structure) constituted by the first sensing pads 120 and the second sensing pads 130. That is, the density of sensing pattern constituted by the first sensing pads 120 and the second sensing pads 130 is greater than the density of the sensing pattern of the extension sensing pad 140. In other words, a sensing precision of the extension sensing pad 140 may be lower than a sensing precision of the body sensing pad structure, so as to save the costs.

Figure 11:
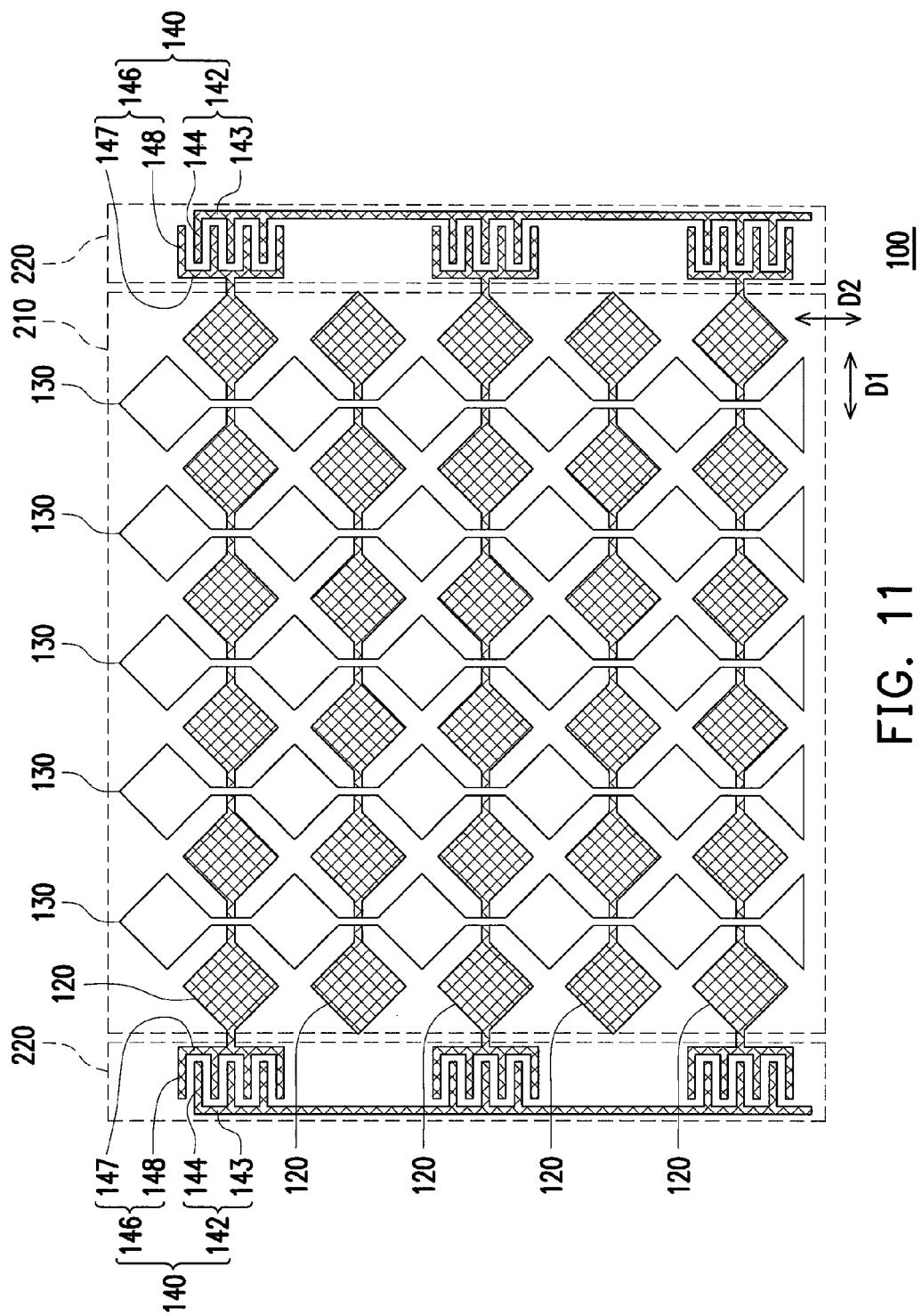
FIG. 11 and FIG. 12 are schematic views of another touch panel according to various embodiments of the invention.

In the present embodiment, the extension sensing pad 140 of FIG. 1 has a comb pattern or other applicable sensing patterns. Persons applying the present embodiment should be able to implement the extension sensing pad 140 by using other sensing pad patterns. In the present embodiment, the comb pattern of the extension sensing pad 140 is constituted by a first electrode axis 142 and a plurality of second electrode blocks 146. The first electrode axis 142 includes a plurality of first horizontal-rod portions 144 formed and respectively extended along the first direction D1 and a vertical-rod portion 143 formed and extended along the second direction D2, and each of the first horizontal-rod portions 144 is formed and extended from the vertical-rod portion 143 along the first direction D1. Each of the second electrode blocks 146 includes a second vertical-rod portion 147 formed along the second direction D2 and a plurality of second horizontal-rod portions 148 formed along the first direction D1, and each of the second horizontal-rod portions 148 is formed and extended from the second vertical-rod portion 147 along the first direction D1. In the present embodiment of FIG. 1, each row of the first sensing pads 120 is corresponding to one of the second electrode blocks 146 being the comb pattern in the extension sensing pad 140, and each row of the first sensing pads 120 is connected to the second linear-rod portion 147 of the second electrode block 146. On the other hand, FIG. 11 is a schematic view of another touch panel according to various embodiments of the invention. In FIG. 11, only several rows of the first sensing pads 120 are corresponding to the second electrode block 146 being the comb pattern and connected thereto, as long as the touch control circuit can be informed of touch signals from the extension sensing pad 140. In other words, a total of the second electrode blocks 146 at one single side may be less than a total of rows of the first sensing pads 120. And, the density of sensing pattern constituted by the first sensing pads 120 and the second sensing pads 130 is greater than the density of the sensing pattern of the extension sensing pad 140.

Figure 12:
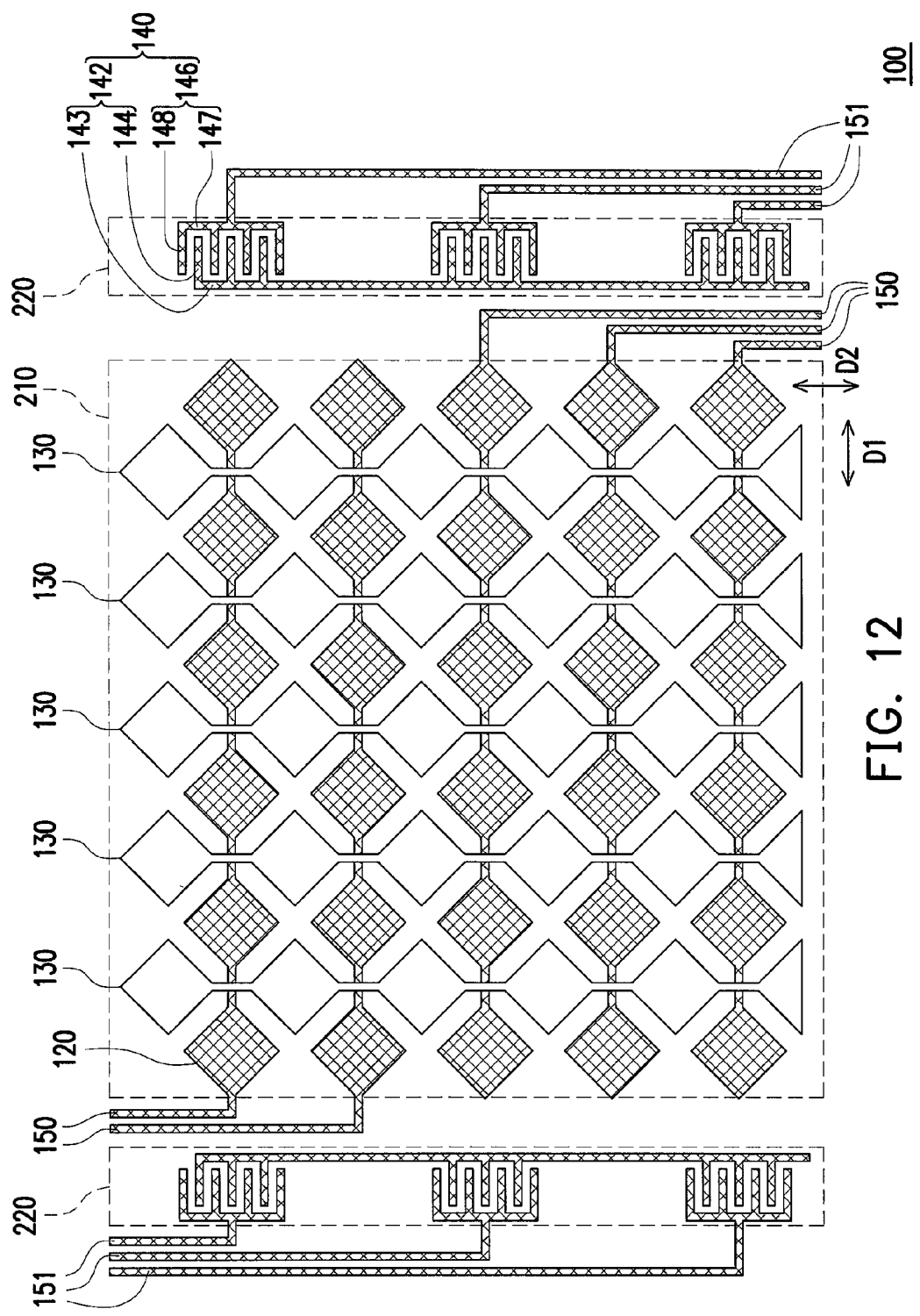

Furthermore, in another embodiment, the first sensing pads 120 and the extension sensing pad 140 can also be corresponding to each other only instead of electrically connecting to each other, as shown in FIG. 12, which is a schematic view of another touch panel according to various embodiments of the invention. In FIG. 12, the first sensing pads 120 and the extension sensing pad 140 can be electrically connected to an external controller respectively by using a signal line 150 and a signal line 151, so that the external controller can perform corresponding operations according to the touch signals received through the signal lines 150 and 151.

Figure 3:
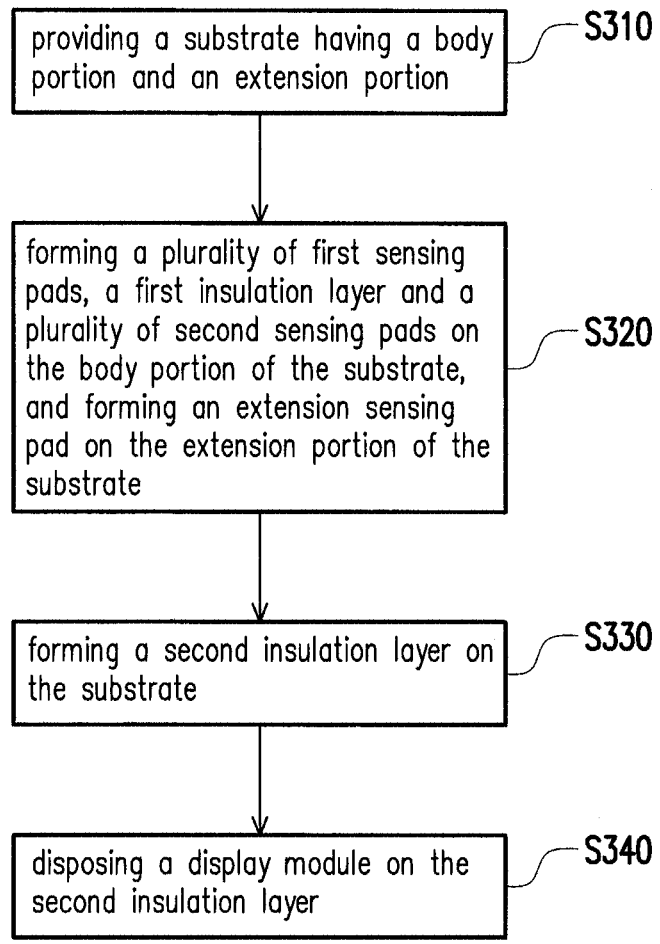
FIG. 3 is a flowchart illustrating a fabrication method of the touch panel according to various embodiments of the invention.

The touch panel 100 depicted in FIG. 1 can be implemented by using a plurality of fabrication methods and means. Hereinafter, various embodiments are provided below as proofs for the spirit of the embodiments of the invention, and persons applying the present embodiment should be able to properly adjust and apply the same according to the embodiments. FIG. 3 is a flowchart illustrating a fabrication method of the touch panel 100 according to various embodiments of the invention. FIG. 2, and FIG. 4 to FIG. 9 are cross-sectional views of the touch panel 100 according to various embodiments of the invention. FIG. 2, and FIG. 4 to FIG. 9 of the present embodiment are used to describe attaching sequences and fabrications for modules in each layer of the touch panel 100, and persons applying the present embodiment should be able to properly adjust the same according to the foregoing embodiments.

Referring to FIG. 2 and FIG. 3, in step S310, the substrate 110 having the body portion 210 and the extension portion 220 is provided. The embodiment corresponding to the substrate 110 has been disclosed in the foregoing description, which is not repeated hereinafter. In step S320, the first sensing pads 120, a first insulation layer 250 and the second sensing pads 130 are formed on the body portion 210 of the substrate 110, and the extension sensing pad 140 is formed on the extension portion 220 of the substrate 110. In the present embodiment, the materials of the first sensing pads 120 and the extension sensing pad 140 are the same. Therefore, in step S320, the first sensing pattern layer 240 having the first sensing pads 120 and the extension sensing pad 140 is formed on both the body portion 210 and the extension portion 220 of the substrate 110 at the same time.

Figure 4:
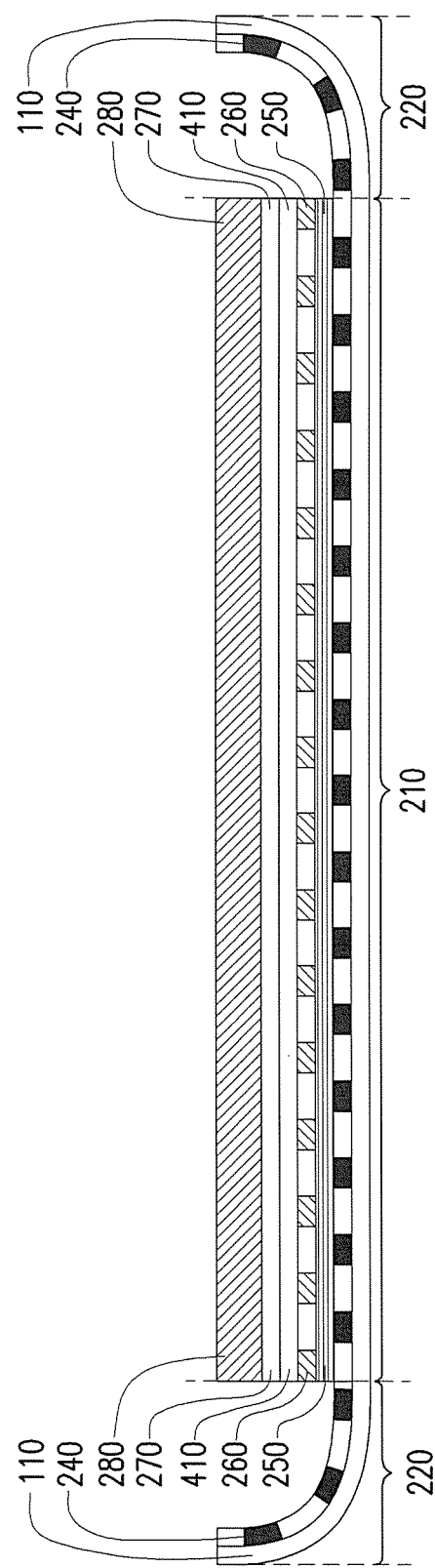
FIG. 4 to FIG. 9 are cross-sectional views of the touch panel according to various embodiments of the invention.
Figure 5:
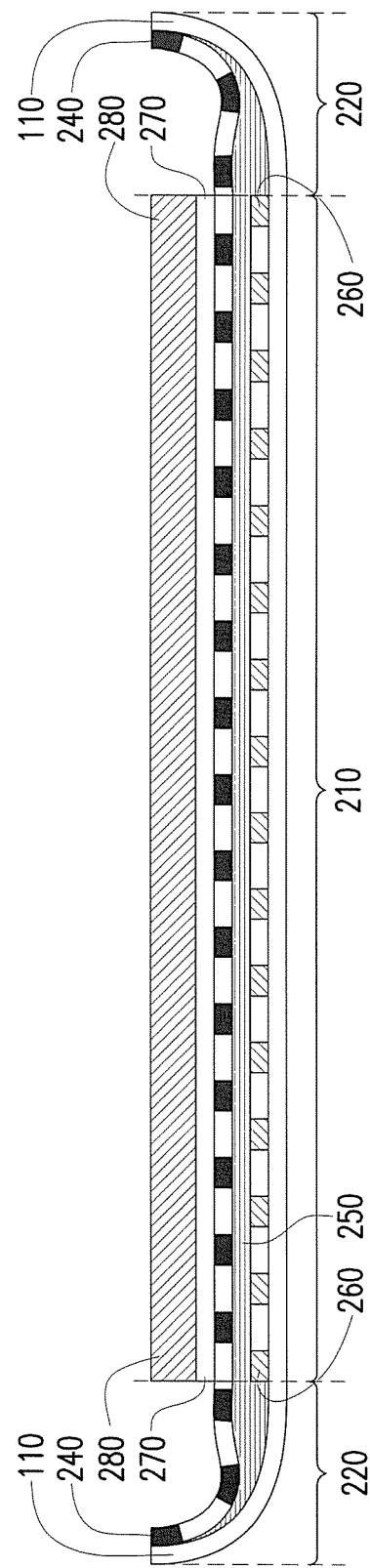
Figure 6:
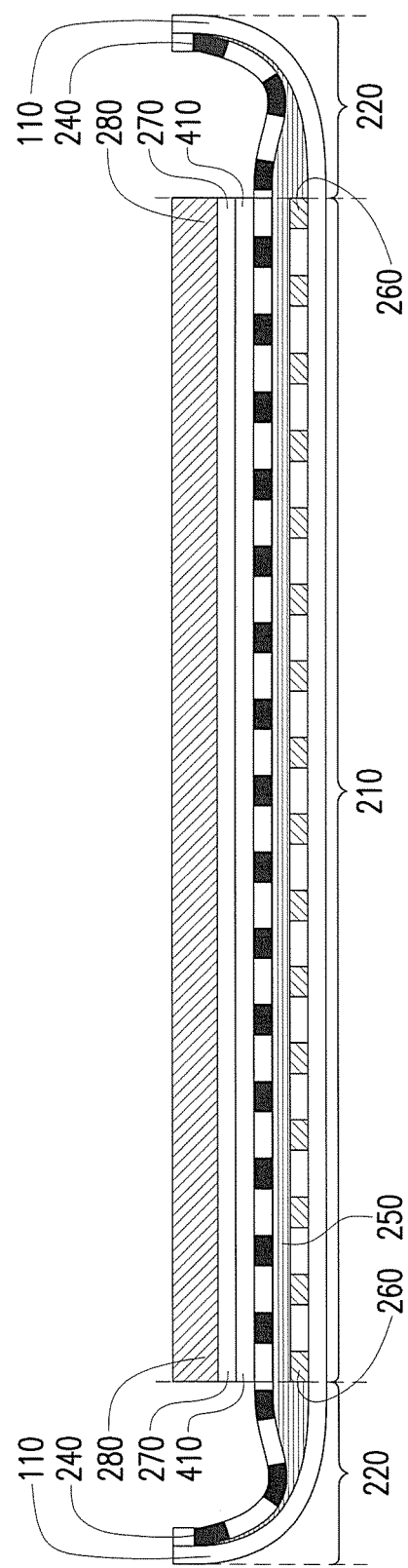

Accordingly, step S320 can include various implementations. One of the implementations includes the following. After the first sensing pattern layer 240 having the first sensing pads 120 and the extension sensing pad 140 is formed on the substrate 110, the first insulation layer 250 is disposed on the first sensing pattern layer 240, and then the second sensing pattern layer 260 having the second sensing pads 130 is formed on the first insulation layer 250 (e.g., as shown in FIG. 2 and FIG. 4). Another one of the implementations includes the following. After the second sensing pattern layer 260 having the second sensing pads 130 is formed on the substrate 110, the first insulation layer 250 is disposed on the second sensing pattern layer 260, and then the first sensing pattern layer 240 having the first sensing pads 120 and the extension sensing pad 140 is formed on the disposed first insulation layer 250 (e.g., as shown in FIG. 5 and FIG. 6). Yet another one of the implementations includes the following. The first sensing pattern layer 240 having the first sensing pads 120 and the extension sensing pad 140 is formed on a first film which is flexible and a plane shape, and the second sensing pattern layer 260 having the second sensing pads 130 is formed on a second film. Thereafter, the first film is bent by heating or physical bending in order to form the substrate 110 having the body portion 210 and the extension portion 220. Next, the second film is attached to the substrate 110. In the following descriptions, different embodiments are used to describe diverse implementations of step S320.

In step S330, after the first sensing pattern layer 240, the first insulation layer 250 and the second sensing pattern layer 260 are disposed on the substrate, a second insulation layer 270 is formed on the substrate. After the second insulation layer 270 is formed, in step S340, a display module 280 is disposed on the second insulation layer. In the present embodiment, the display module 280 can be a display apparatus with corresponding display technology such as a liquid crystal display module, a light-emitting semiconductor module, an organic light-emitting semiconductor module and so on. In the present, the first insulation layer 250 and the second insulation layer 270 may be insulation materials such as polyimide film, optical clear adhesive (OCA) and so on.

The diverse implementations of step S320 can be described respectively by various embodiments composed of FIG. 2, and FIG. 4 to FIG. 9. Referring to FIG. 2, after the substrate 110 having the body portion 210 and the extension portion 220 is provided, the first sensing pads 120 and the second sensing pads 130 can be formed on the body portion 210 of the substrate 110 by using a first material film (e.g., a metal mesh film), so as to form the first sensing pattern layer 240. The metal mesh film can be disposed on the substrate 110 by using electroplating, screen printing, ink-jet printing or other methods. Subsequently, the first insulation layer 250 is formed on the first sensing pattern layer 240 where the first sensing pads 120 and the extension sensing pad 140 are located. The second sensing pads are formed on the first insulation layer 250 by using a second material film (e.g., the ITO film) to form the second sensing pattern layer 260. Sensing pattern of the ITO film can be formed on the first insulation layer 250 by using methods such as a photolithography process and so on.

Referring to FIG. 4, as in comparison with FIG. 2, the touch panel of FIG. 4 further includes a protection layer 410 disposed on the second sensing pattern layer 260, and the second insulation layer 270 and the display module 280 are sequentially disposed on the protection layer 410. The protection layer 410 is capable of providing effects of protection and strengthening to general structural strength. In the present embodiment, the protection layer 410 can be a glass layer, a transparent plastic layer or an insulation transparent layer formed by other materials.

Referring to FIG. 5, in the touch panel of FIG. 5, first, after the second sensing pattern layer 260 having the second sensing pads 130 is formed on the substrate 110, the first insulation layer 250 is disposed on the second sensing pattern layer 260 by using a deposition method or a coating method. Further, after the first insulation layer 250 is disposed, the first sensing pattern layer 240 having the first sensing pads 120 and the extension sensing pad 140 is formed on the first insulation layer 250 by using electroplating, screen printing, ink-jet printing or other methods. Thereafter, the second insulation layer 270 and the display module 280 are sequentially disposed at the first sensing pattern layer 240 on the body portion 210 of the substrate 110. Referring to FIG. 6, as in comparison with FIG. 5, the touch panel of FIG. 6 further includes the protection layer 410 disposed on the first sensing pattern layer 240, and the second insulation layer 270 and the display module 280 are sequentially disposed on the protection layer 410. The protection layer 410 is capable of providing effects of protection and strengthening to general structural strength.

Figure 7:
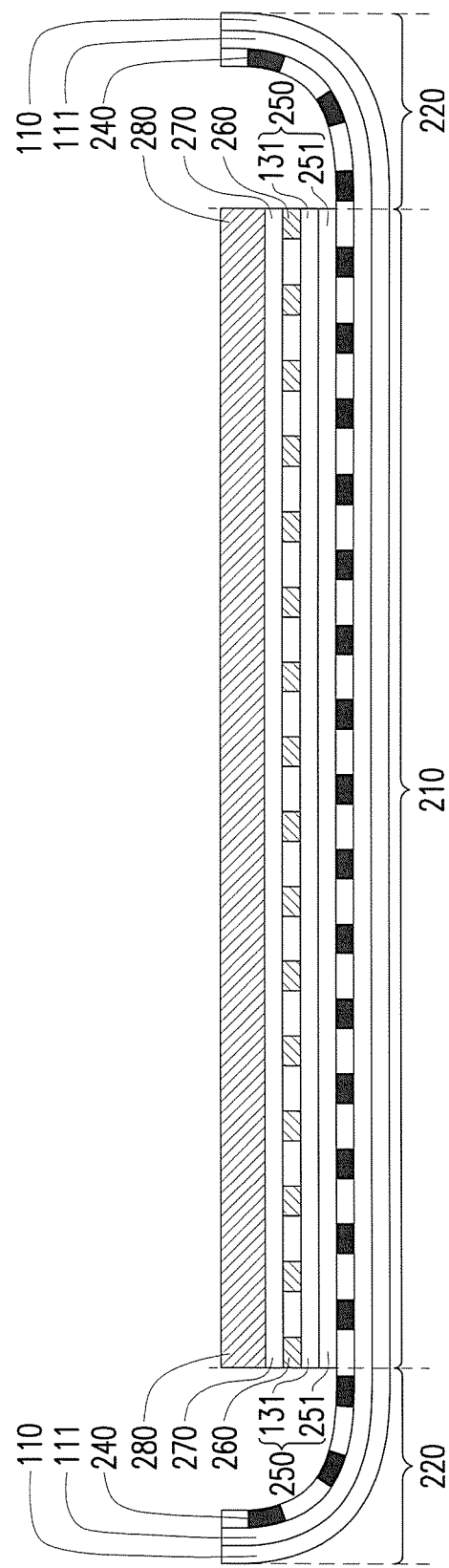

Referring to FIG. 7, in the embodiment of FIG. 7, first, the first sensing pattern layer 240 having the first sensing pads 120 and the extension sensing pad 140 is disposed on a first film 111 (which is flexible), and the second sensing pattern layer 260 having the second sensing pads 130 is disposed on a second film 131 different from the first film. The first sensing pattern layer 240 and the second sensing pattern layer 260 can be formed on the first film 111 and the second film 131 by using, for example, a roll to roll process. The first film 111 can be an insulation film layer made of plastics or other flexible materials. Thereafter, the first film 111 can be bent by heating or physical bending to be attached to the substrate 110 having the body portion 210 and the extension portion 220, so as to complete disposition for the substrate 110, the first film 111 and the first sensing pattern layer 240. Thereafter, the second film 131 and the first film 111 are attached by using an optically clear adhesive 251, such that the second film 131 and the optical clear adhesive 251 collectively become the first insulation layer 250. Then, the second insulation layer 270 and the display module 280 are sequentially disposed on the second sensing pattern layer 260, so as to complete disposition of each layer between the substrate 110 and the display module 280.

Figure 8:
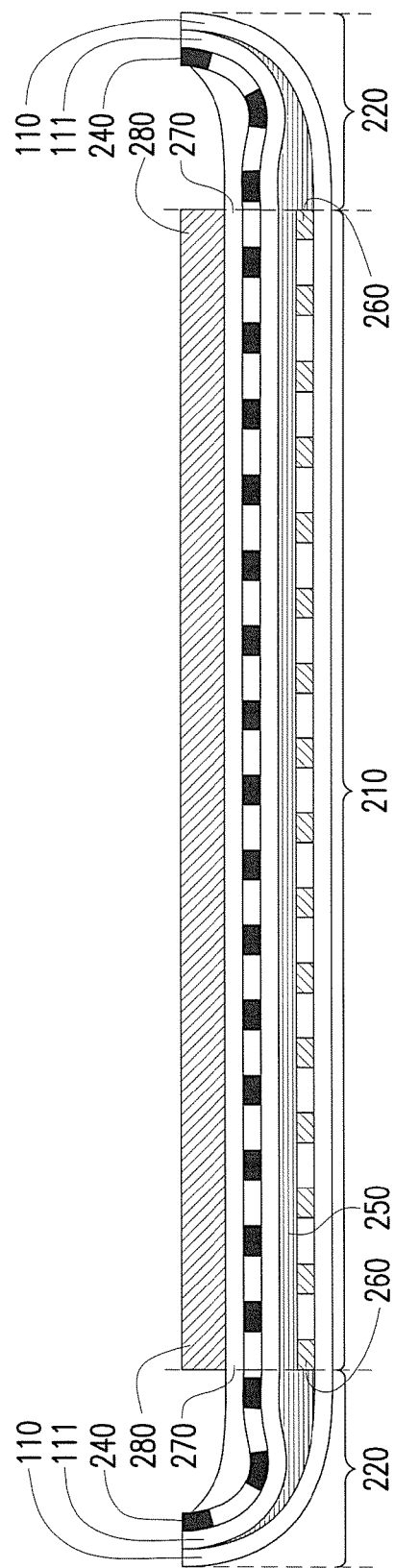

Referring to FIG. 8, in the embodiment of FIG. 8, first, the first sensing pattern layer 240 having the first sensing pads 120 and the extension sensing pad 140 is formed on the first film 111 (which is flexible). Then, the second sensing pattern layer 260 having the second sensing pads 130 is formed on the substrate 110. The second sensing pattern layer 260 can be formed on the substrate 110 by using the photolithography process. Subsequently, the first insulation layer 250 is formed on the second sensing pattern layer 260. Thereafter, the first film 111 can be bent by heating or physical bending to be attached to the substrate 110 and the first insulation layer 250, so as to complete disposition of each layer between the substrate 110 and the first sensing pattern layer 240. Thereafter, the second insulation layer 270 and the display module 280 are sequentially disposed on the first sensing pattern layer 240.

Figure 9:
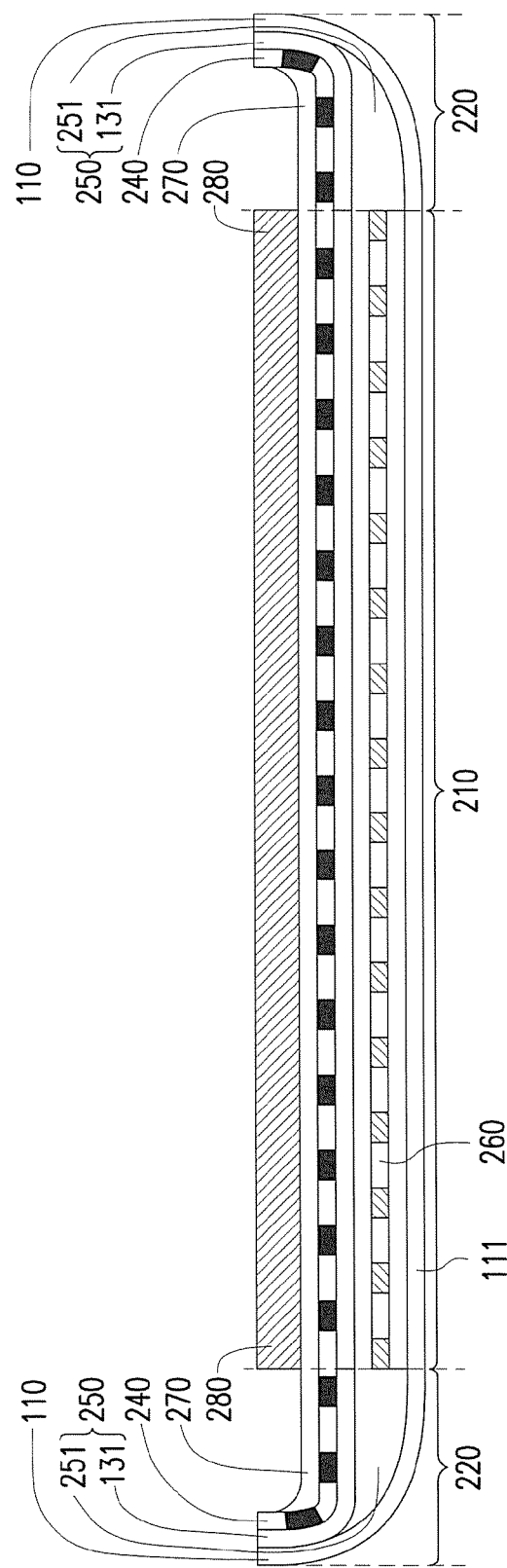

Referring to FIG. 9, in the embodiment of FIG. 9, first, the second sensing pattern layer 260 having the second sensing pads 130 is formed on the first film 111 (which is flexible) by using the photolithography process, and the first sensing pattern layer 240 having the first sensing pads 120 and the extension sensing pad 140 is formed on the second film 131 by using methods such as the screen printing or the photolithography process. Thereafter, the first film 111 can be bent by heating or physical bending to be attached to the substrate 110 having the body portion 210 and the extension portion 220, so as to complete disposition for the substrate 110, the first film 111 and the second sensing pattern layer 260. Thereafter, the second film 131 having the first sensing pattern layer 240 is attached to the first film 111 by using the optical clear adhesive 251. The second film 131 and the optical clear adhesive 251 collectively become the first insulation layer 250. Such that disposition of each layer between the substrate 110 and the first sensing pattern layer 240 is complete. Thereafter, the second insulation layer 270 and the display module 280 are sequentially disposed on the first sensing pattern layer 240, so as to complete the touch panel of FIG. 9.

Figure 10:
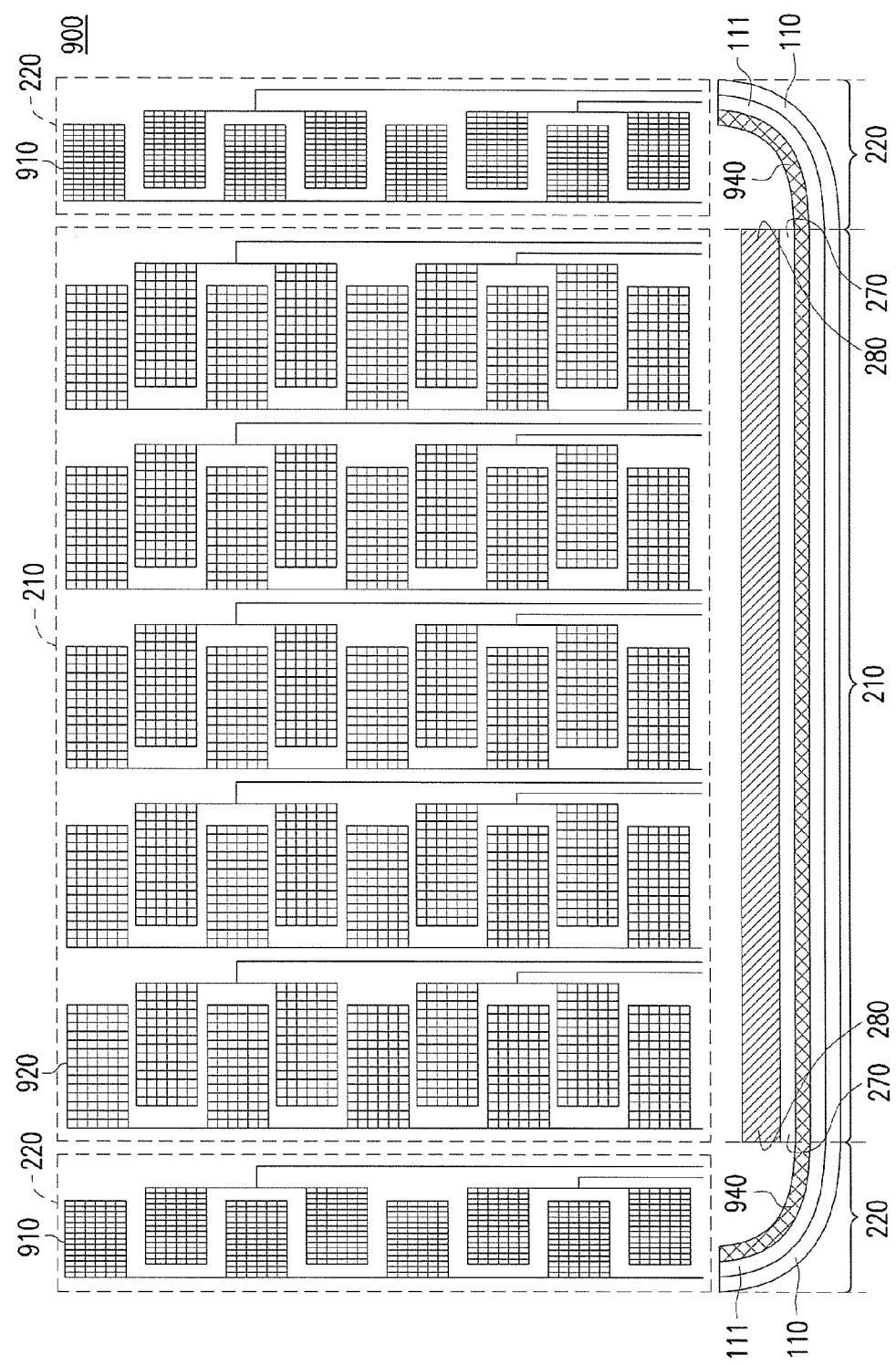
FIG. 10 is a schematic view of a touch panel according to an embodiment of the invention.

Hereinafter, another touch panel compliance with spirit of the embodiments of the invention is provided in FIG. 10 which indicates that the sensing pad structure according to the embodiments of the invention can adopt another sensing pattern. Also, the sensing pattern illustrated in FIG. 10 can be easily adjusted in order to control the sensitivity of the sensing pads. FIG. 10 is a schematic view of a touch panel 900 according to an embodiment of the invention. In the touch panel 900, sensing pad structures 910 and 920 in a metal mesh shape are formed respectively on the body portion 210 and the extension portion 220 of the substrate. It should be noted that, a total of sensing pads of the body sensing pad structure is far grater than a total of sensing pads of the extension sensing pad structure, and a density of sensing pattern of the sensing structure 910 of the body portion 210 can be greater than a density of sensing pattern of the sensing pad structure 920 of the extension portion 220. Furthermore, a shape or a size of units in the sensing pad structure 910 of the body portion 210 can be different from those of units in the sensing pad structure 920 of the extension portion 220. For example, as shown in FIG. 10, a number of the units in the sensing pad structure 910 of the extension portion 220 is reduced in the present embodiment in order to lower the density of sensing pattern thereof, and the size of the units in the sensing pad structure 910 is also different from the size of the units in the sensing pad structure 920. For example, the number of the units in the sensing pad structure 910 of the body portion 210 in the embodiments of the invention is five times to twenty times than the number of the units in the sensing pad structure 910 of the extension portion 220. In the present embodiment, first, a metal mesh sensing layer 940 for forming the sensing pad structures 910 and 920 is disposed on the first film 111 by using the method of screen printing or other processes. Then, the first film 111 is bent by heating or physical bending. Thereafter, the first film 111 is attached on the substrate 110 having the body portion 210 and the extension portion 220, so as to complete disposition for the substrate 110, the first film 111 and the metal mesh sensing layer 940. Thereafter, the second insulation layer 270 and the display module 280 are sequentially disposed on the metal mesh sensing layer 940. It should be noted that, in the present embodiment, the metal mesh sensing layer 940 is the single-layer sensing structure in either the body portion 210 or the extension portion 220, and thus it is not required to dispose another second sensing layer additionally on the body portion 210.

In summary, in the touch panel according to the embodiments, at least one sensing pad structure (which is more flexible) is disposed on the substrate being the curved structure, and the sensing pads structure (which is more flexible) is more preferably to be formed by the metal materials. Among them, this sensing pad structure at the bent extension portion of the substrate is the single-layer sensing pad structure. Accordingly, the electronic device adopting this touch panel is capable of providing the touch functions at the lateral sides of the body thereof, so as to replace the functions of the physical buttons.

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel, comprising:
    a substrate, having a body portion and a curved extension portion, and the substrate is a glass substrate;
    a plurality of first sensing pads, arranged abreast on the body portion of the substrate along a first direction;
    an extension sensing pad, arranged on the curved extension portion of the substrate, the extension sensing pad and the first sensing pads being made of metal, and the extension sensing pad and the first sensing pads being formed by a same first sensing pattern layer, wherein the body portion of the substrate is located on a plane, the curved extension portion is not located on the plane and an extension plane of the plane, an edge of the curved extension portion as well as a body of the curved extension portion doesn't overlap the body portion in a direction perpendicular to the plane, and wherein the extension sensing pad is a single-layer sensing pad structure, a whole of the extension sensing pad is fully located within an area of the curved extension portion, the extension sensing pad includes a first electrode axis and a plurality of first electrode blocks spaced apart from each other, and each of the first electrode blocks is electrically connected with one of the first sensing pads respectively; and
    a plurality of second sensing pads, formed by a second sensing pattern layer and arranged abreast on the body portion of the substrate along a second direction, wherein the first direction is intersected with the second direction, and the first sensing pattern layer and the second sensing pattern layer are made of different materials, and wherein the second sensing pattern layer is made of indium tin oxide (ITO), the second sensing pattern layer is less flexible than the first sensing pads and the extension sensing pad, a whole of the second sensing pattern layer is fully located within an area of the body portion so that the first sensing pads and the second sensing pads provide touch sensing in the body portion and the extension pad provides touch sensing in the curved extension portion, and a whole of the first sensing pads and the second sensing pads collectively constitute a double-layer sensing pad structure and are fully located within the area of the body portion.

2. The touch panel of claim 1, wherein the curved extension portion forms a curved shape from an intersection where the curved extension portion is in contact with the body portion according to a curvature.

3. The touch panel of claim 1, wherein the total number of the first sensing pads and the second sensing pads in the body portion is five times to twenty times than the number of the first electrode blocks in the curved extension portion.

4. The touch panel of claim 3, wherein the extension sensing pad has a comb pattern.

5. The touch panel of claim 1, wherein a total of the first electrode blocks is less than a total of rows of the first sensing pads.

6. The touch panel of claim 1, wherein the first sensing pads and the extension sensing pad have a mesh structure.

7. The touch panel of claim 1, wherein a density of sensing pattern constituted by the first sensing pads and the second sensing pads is greater than a density of sensing pattern of the extension sensing pad.

8. The touch panel of claim 1, wherein a structure of the touch panel sequentially comprises:
    the first sensing pattern layer, disposed on the substrate, and the first sensing pattern layer comprising the first sensing pads located on the body portion and the curved extension portion located on the curved extension portion;
    a first insulation layer, disposed on the first sensing pattern layer;
    the second sensing pattern layer, disposed on the first insulation layer, and the second sensing pattern layer having the second sensing pads;
    a second insulation layer, disposed on the second sensing pattern layer; and
    a display module, disposed on the second insulation layer.

9. The touch panel of claim 1, wherein a structure of the touch panel sequentially comprises:
    the second sensing pattern layer, having the second sensing pads, and disposed on the body portion of the substrate;
    a first insulation layer, disposed on the second sensing pattern layer and the curved extension portion of the substrate;
    the first sensing pattern layer, having the first sensing pads and the curved extension sensing pad, and disposed on the first insulation layer and the curved extension portion;
    a second insulation layer, disposed on the first sensing pattern layer; and
    a display module, disposed on the second insulation layer.

10. The touch panel of claim 1, wherein a structure of the touch panel sequentially comprises:
    a first film and the first sensing pattern layer, disposed on the substrate, wherein the first sensing pattern layer having the first sensing pads and the extension sensing pad is already formed on the first film;
    a second film and the second sensing pattern layer, disposed on the first film having the first sensing pattern layer, wherein the second sensing pattern layer having the second sensing pads is already formed on the second film and a whole of the second film and the second sensing pattern layer is located within the area of the body portion;
    a second insulation layer, disposed on the second film located on the body portion; and
    a display module, disposed on the second insulation layer.

11. The touch panel of claim 1, wherein a structure of the touch panel sequentially comprises:
    a first film and the second sensing pattern layer, disposed on the substrate, wherein the second sensing pattern layer having the second sensing pads is already formed on the first film;

a second film and the first sensing pattern layer, disposed on the first film having the first sensing pattern layer, wherein the first sensing pattern layer having the first sensing pads and the extension sensing pad is already formed on the second film and a whole of the second film and the second sensing pattern layer is located within the area of the body portion;

a second insulation layer, disposed on the second film located on the body portion; and a display module, disposed on the second insulation layer.

12. A touch panel, comprising:

a substrate, having a body portion and a curved extension portion, and the substrate is a glass substrate;

a body sensing pad structure, disposed on the body portion of the substrate; and an extension sensing pad structure, disposed on the curved extension portion of the substrate, a whole of the extension sensing pad structure is fully located within an area of the curved extension portion, wherein a total of sensing pads of the body sensing pad structure is greater than a total of sensing pads of the extension sensing pad structure, the body portion is located on a plane, the curved extension portion is not located on the plane and an extension plane of the plane, and an edge of the curved extension portion as well as a body of the curved extension portion doesn't overlap the body portion in a direction perpendicular to the plane, wherein the sensing pads of the body pad structure are formed by a first sensing pattern layer and a second sensing pattern layer, the sensing pads of the extension sensing pad structure are formed by the first sensing pattern layer, and the first sensing pattern layer is extended from the body portion to the curved extension portion while a whole of the second sensing pattern layer is fully located within the body portion, wherein the first sensing pattern layer is made of metal, the second sensing pattern layer is made of ITO, the second sensing pattern layer is less flexible than the first sensing pattern layer.

13. The touch panel of claim 12, wherein a density of sensing pattern of the body sensing pad structure is greater than a density of sensing pattern of the extension sensing pad structure.

14. The touch panel of claim 12, wherein the curved extension portion forms a curved shape from an intersection where the curved extension portion is in contact with the body portion according to a curvature.

* * * * *